(12) United States Patent
Ramamoorthi et al.

(10) Patent No.: US 6,558,968 B1
(45) Date of Patent: May 6, 2003

(54) METHOD OF MAKING AN EMITTER WITH VARIABLE DENSITY PHOTORESIST LAYER

(75) Inventors: Sriram Ramamoorthi, Corvallis, OR (US); Zhizhang Chen, Corvallis, OR (US)

(73) Assignee: Hewlett-Packard Development Company, Palo Alto, CA (US)

( * ) Notice: Subject to any disclaimer, the term of this patent is extended or adjusted under 35 U.S.C. 154(b) by 0 days.

(21) Appl. No.: 10/002,422

(22) Filed: Oct. 31, 2001

(51) Int. Cl.⁷ .............................................. H01L 21/00
(52) U.S. Cl. ............................................ 438/20; 445/51
(58) Field of Search ............................. 438/20; 445/24, 445/50, 51

(56) References Cited

U.S. PATENT DOCUMENTS

| | | | |
|---|---|---|---|
| 4,303,930 A | 12/1981 | Van Gorkom et al. ......... 357/13 |
| 4,516,146 A | 5/1985 | Shannon et al. ............... 357/52 |
| 4,923,421 A | 5/1990 | Brodie et al. .................. 445/24 |
| 5,017,266 A * | 5/1991 | Zdeblick et al. ............... 216/11 |
| 5,090,932 A | 2/1992 | Dieumegard et al. ......... 445/24 |
| 5,414,272 A | 5/1995 | Watanabe et al. ............. 257/10 |
| 5,554,859 A | 9/1996 | Tsukamoto et al. ........... 257/10 |
| 5,557,596 A | 9/1996 | Gibson et al. ............... 369/101 |
| 5,559,342 A | 9/1996 | Tsukamoto et al. ........... 257/10 |
| 5,688,158 A * | 11/1997 | Jones et al. .................... 445/50 |
| 5,702,870 A | 12/1997 | Brugge ........................ 430/314 |
| 5,760,417 A | 6/1998 | Watanabe et al. ............. 257/11 |
| 5,814,832 A | 9/1998 | Takeda et al. ................. 257/10 |
| 5,906,910 A | 5/1999 | Nguyen et al. ............... 430/211 |
| 5,930,890 A | 8/1999 | Chou et al. ................... 29/852 |
| 5,982,091 A | 11/1999 | Konishi ........................ 313/495 |
| 6,008,576 A | 12/1999 | Nakatani et al. ............. 313/495 |
| 6,010,918 A * | 1/2000 | Marino et al. ............... 313/293 |
| 6,011,356 A | 1/2000 | Janning et al. ........... 315/169.4 |
| 6,023,124 A | 2/2000 | Chuman et al. ............. 313/310 |
| 6,096,570 A | 8/2000 | Hattori ........................ 438/20 |
| 6,107,732 A | 8/2000 | Tolt ............................. 313/495 |
| 6,137,212 A | 10/2000 | Liu et al. ..................... 313/308 |
| 6,249,080 B1 * | 6/2001 | Komoda et al. ............. 313/310 |
| 6,274,881 B1 * | 8/2001 | Akiyama et al. ............. 257/10 |
| 2001/0020733 A1 * | 9/2001 | Sasaguri ....................... 257/653 |

OTHER PUBLICATIONS

Toshiaki, K., et al. "Increasing Emission Current from MIM Cathodes by Using an Ir–Pt–Au Multilayer Top Electrode." IEEE Transactions on Electron Devices, vol. 47, No. 8, Aug. 2000, 1667–1672.

* cited by examiner

Primary Examiner—John F. Niebling
Assistant Examiner—Angel Roman
(74) Attorney, Agent, or Firm—Timothy F. Myers (57) ABSTRACT

An emitter has an electron supply layer and a tunneling layer formed on the electron supply layer. Optionally, an insulator layer is formed on the electron supply layer and has openings defined within in which the tunneling layer is formed. A cathode layer is formed on the tunneling layer. A conductive layer is partially disposed on the cathode layer and partially on the insulator layer if present. The conductive layer defines an opening to provide a surface for energy emissions of electrons and/or photons. Preferably but optionally, the emitter is subjected to an annealing process thereby increasing the supply of electrons tunneled from the electron supply layer to the cathode layer.

16 Claims, 12 Drawing Sheets

METHOD OF MAKING AN EMITTER WITH VARIABLE DENSITY PHOTORESIST LAYER

FIELD OF THE INVENTION

The invention is directed to field emission devices. In particular the invention is directed to flat field emission emitters utilizing tunneling and their use in electronic devices.

BACKGROUND OF THE INVENTION

Several different field emission devices have been proposed and implemented to create electron emissions useful for displays or other electronic devices such as storage devices. Traditionally, vacuum devices with thermionic emission such as electron tubes required the heating of cathode surfaces to create electron emission. The electrons are drawn in a vacuum space to an anode structure that is at a predetermined voltage potential which attracts the electrons. For a display device such as a cathode ray tube, the anode structure is coated with phosphors such that when an electron impinges on the phosphor, photons are generated thereby creating a visible image. Cold cathode devices such as spindt tips (pointed tips) have been used or proposed to replace the hot cathode technology in some applications. However, it has been difficult to reduce the size and integrate several spindt tips while maintaining reliability. As the size is reduced, the spindt tip becomes more susceptible to damage from contaminants in the vacuum that are ionized when an electron strikes it. The ionized contaminant is then attracted to the spindt tip and collides with it, thereby causing damage. To increase the life of the spindt tip, the vacuum space must have an increasingly high vacuum. A flat emitter having a larger emission surface can be operated reliably at lower vacuum requirements. However, for some applications, the amount of current density from conventional flat emitters is not high enough to be useful. Thus a need exists to create a flat emitter that has high-energy current density that is also able to operate reliably in low vacuum environments.

SUMMARY

An emitter has an electron supply layer and a tunneling layer formed on the electron supply layer. Optionally, an insulator layer is formed on the electron supply layer and has openings defined within in which the tunneling layer is formed. A cathode layer is formed on the tunneling layer. A conductive layer is partially disposed on the cathode layer and partially on the insulator layer if present. The conductive layer defines an opening to provide a surface for energy emissions of electrons and/or photons. Preferably but optionally, the emitter is subjected to an annealing process thereby increasing the supply of electrons tunneled from the electron supply layer to the cathode layer.

BRIEF DESCRIPTION OF THE DRAWINGS

The invention is better understood with reference to the following drawings. The elements of the drawings are not necessarily to scale relative to each other. Rather, emphasis has instead been placed upon clearly illustrating the invention. Furthermore, like reference numerals designate corresponding similar parts through the several views.

DETAILED DESCRIPTION OF THE PREFERRED AND ALTERNATE EMBODIMENTS

The present invention is directed to field emission emitters that provide high levels of emission current per square centimeter by using a tunneling layer that has a sufficient thinness between about 50 and about 5000 Angstroms to create an electric field between an electron source and a flat cathode surface. Conventional flat emitter type devices have low emission current per square centimeter of surface area and thus are not usable in several applications. The invention uses a thin deposition of either a silicon-based dielectric having suitable defects, a metal cluster dielectric having high dielectric strength for direct tunneling, or other tunneling material, to create a barrier in which electrons can tunnel between the electron source and the cathode surface preferably directly or through the defects within the dielectric. By using such material, the emission current can be greater than 10 mAmps, 100 mAmps, or 1 Amp per square centimeter which is one, two, or three orders of magnitude, respectively, greater than that of conventional flat emitter technology. The actual emission rate will depend upon the design choices of the type and thickness of material used for the tunneling layer. In addition to electron emissions, the invention is also able to create photon emissions that provides for additional uses for the emitter incorporating the invention. Further advantages and features of the invention will become more apparent in the following description of the invention, its method of making and various applications of use.

In the illustrations of this description, various parts of the emitter elements have not been drawn to scale. Certain dimensions have been exaggerated in relation to other dimensions in order to provide a clearer illustration and understanding of the present invention. For the purposes of illustration, the embodiments illustrated herein are shown in two-dimensional views with various regions having depth and width. It should be understood that these region are illustrations only of a portion of a single cell of a device, which may include a plurality of such cells arranged in three-dimensional structures. Accordingly, these regions will have three dimensions, including length, width, and depth when fabricated on an actual device.

Further, one aspect of the invention is that it can be fabricated using conventional integrated circuit thin-film technologies. Several different technologies exist to perform several of the process steps and can be interchanged by those having skill in the art. For example, deposition of material can be by one of several processes such as evaporation, sputtering, chemical vapor deposition, molecular beam epitaxy, photochemical vapor deposition, low temperature photochemical vapor deposition, and plasma deposition, to name a few. Additionally, several different etch technologies exist such as wet etching, dry etching, ion beam etching, reactive ion etching, and plasma etching such as barrel plasma etching and planar plasma etching to name some of the possible etching technologies. Choice of actual technologies used will depend on material used and cost criteria among other factors.

Figure 1:
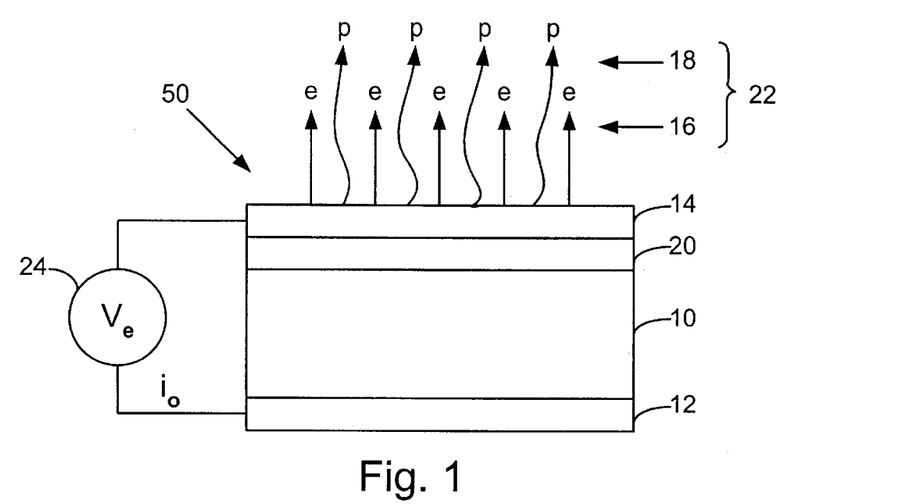
FIG. 1 is an exemplary illustration of a tunneling emitter incorporating the invention.

FIG. 1 is an exemplary diagram of an emitter device 50, preferably a flat emitter for electron and photon emission, which includes an electron source 10. On the electron source 10 is a tunneling layer 20. Preferably, the tunneling layer 20 is formed from a metal cluster dielectric or a silicon-based dielectric. Exemplary metal cluster dielectrics include tungsten silicon nitrate (WSiN) or tantalum oxide (TaO$_x$), titanium oxide (TiO$_x$, where x=0.5 to 2.5). Also, tantalum aluminum oxynitride (TaAlO$_x$N$_y$), tantalum aluminum oxide (TaAlO$_x$), aluminum oxynitride (AlO$_x$N$_y$) or other transitionary metal (TM) oxides or oxynitrides ((TM)O$_x$ or (TM) O$_x$N$_y$) are envisioned as being capable of use as tunneling layer 20. A metal cluster dielectric tunneling layer preferably has a thickness less than 500 Angstroms and more preferably the thickness is within the range of about 50 to about 250 Angstroms, such as 100 Angstroms or less. Exemplary silicon-based dielectrics are SiN$_x$, Si$_3$N$_4$(RI~2.0), Si$_x$N$_y$ (x:y>¾, RI~2.3), and SiC. Also, F$_y$—SiO$_x$ and C$_y$—SiO$_x$ are envisioned as being capable of use as tunneling layer 20. The silicon-based dielectric layer preferably has a thickness about 500 Angstroms and more preferably the thickness is within the range of about 250 to about 5000 Angstroms, such as 500 Angstroms or less. The chosen thickness determines the electrical at field strength that the tunneling layer 20 must be able to withstand and the desired emitter emission current. Disposed on the tunneling layer 20 is a cathode layer 14, preferably a thin-film conductor such as platinum, gold, molybdenum, iridium, ruthenium, tantalum, chromium, or other refractive metals or alloys thereof. Other cathode layers can be used and are known to those skilled in the art. Preferably, the thickness of the cathode layer is 30 to 150 Angstroms. When a voltage source 24 having an emitter voltage V$_e$ (about 3–20V) is applied to the cathode layer 14 and electron supply 10 via a contact 12, electrons tunnel directly or indirectly from the substrate 10 (an electron supply) to the cathode layer 14. When there are defects within the tunneling layer 20, the electric field in which the electrons tunnel through is punctuated with various gaps and the electron emission 16 from the surface of the cathode layer 14 is greater than conventional designs. Alternatively, if the dielectric is thin enough, direct tunneling occurs. Also, some photon emission 18 occurs along with the electron emission 16 to form the energy emission 22 from the emitter 50.

The electron field is calculated for various thickness as $$\vec{E} = \frac{V_e}{t_{thickness}}$$

where t$_{thickness}$ is the thickness of tunneling layer 20. For example, for a V$_e$=10V, the electric field is equal to 2×10$^6$ volts/meter for a 500 Angstrom thickness in the tunneling layer 20. The minimum thickness for a particular dielectric will depend on its dielectric strength.

Preferably, a metal cluster dielectric tunneling layer 20 is sputter deposited. By using metal cluster dielectrics as the tunneling layer, very high electric field strength can be applied between the electron source 10 and the cathode layer 14 to achieve higher emission, because the metal cluster dielectrics withstand much higher electrical field strength without electrical breakdown. Metal cluster dielectrics allow for direct tunneling to occur.

Preferably, a silicon-based dielectric tunneling layer 20 is deposited using plasma enhanced chemical vapor deposition (PECVD). By using silicon-based dielectrics as the tunneling layer, defective areas throughout the material are achieved and tunneling is done through the various defects due to the electric field generated between the electron source 10 and the cathode layer 14.

Figure 2:
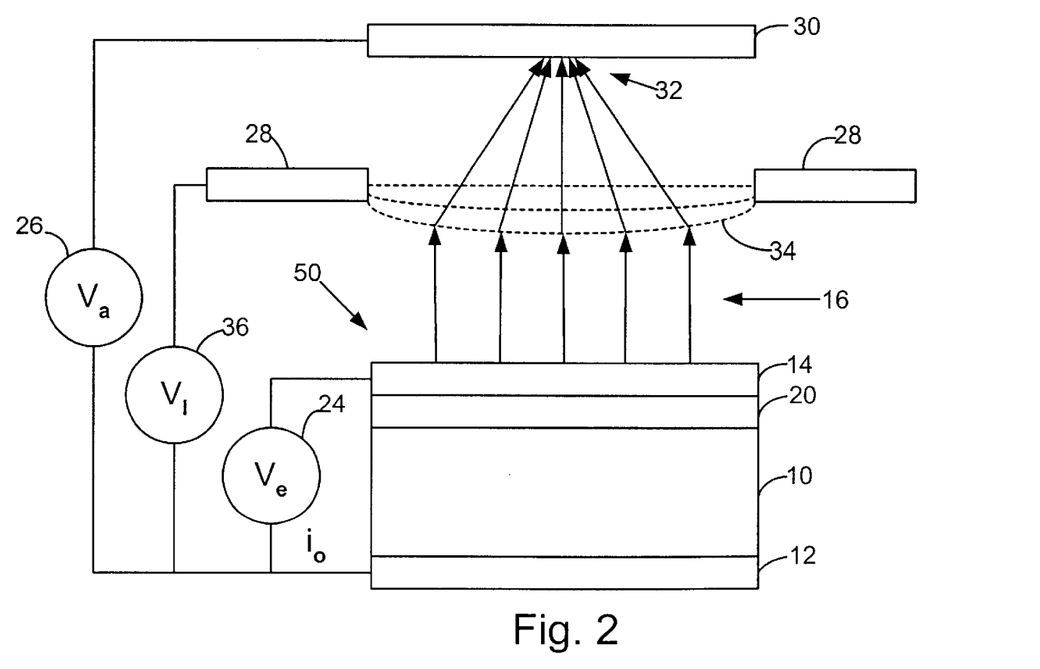
FIG. 2 is an exemplary illustration of the use of the tunneling emitter of FIG. 1 to create a focused electron beam.

FIG. 2 is an exemplary diagram of a use for the emitter 50 of FIG. 1. In this application, the electron emission 16 is focused by an electrostatic focusing device or lens 28, exemplified as an aperture in a conductor that is set at predetermined voltage that can be adjusted to change the focusing effect of the lens 28. Those skilled in the art will appreciate that lens 28 can be made from more than one conductor layer to create a desired focusing effect. The electron emission 16 is focused by lens 28 into a focused beam 32 onto an anode structure 30. The anode structure 30 is set at an anode voltage V$_a$ 26 which magnitude varies for an application depending on the intended use and the distance from the anode structure 30 to the emitter 50. For instance, with anode structure 30 being a recordable medium for a storage device, V$_a$ might be chosen to be between 500 and 1000 Volts. The lens 28 focuses the electron emission 16 by forming an electric field 34 within its aperture. By being set at a proper voltage from V$_e$, the electrons emitted from the emitter 50 are directed to the center of the aperture and then further attracted to the anode structure 30 to form the focused beam 32.

Figure 3:
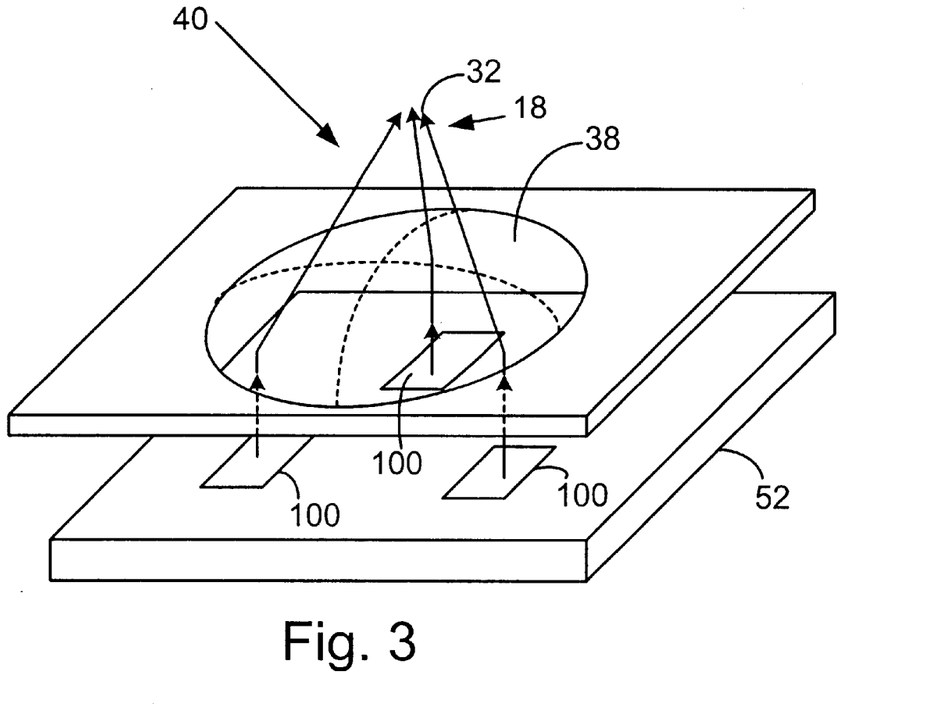
FIG. 3 is an exemplary illustration of an integrated circuit that includes several tunneling emitters and an optical lens to create a display device.

FIG. 3 is an exemplary embodiment of a display 40 having an integrated circuit 52 that includes multiple integrated emitters 100 formed in an array of pixel groups. The integrated emitters 100 emit photon emission 18, a visible light source, which is focused with an optical lens 38 to a focused beam 32 that is viewable as an image. Preferably, the optical lens 38 is coated with a transparent conducting surface, such as indium tin oxide, to capture electrons emitted from the emitter.

Figure 4:
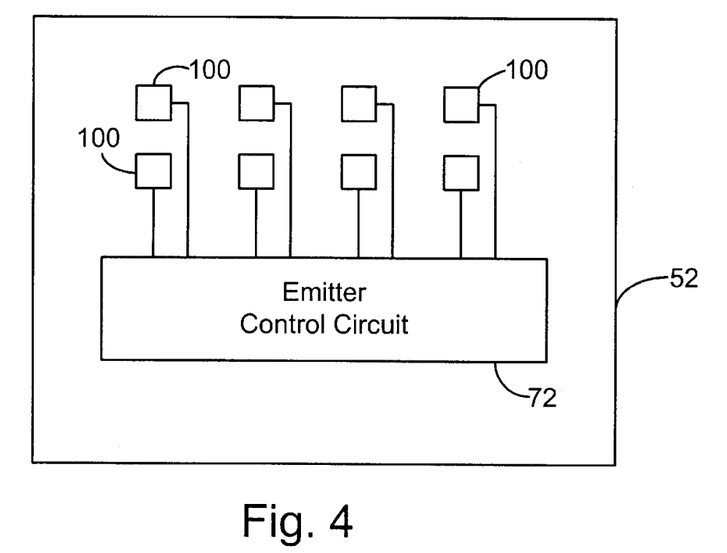
FIG. 4 is an exemplary block diagram of an integrated circuit that incorporates multiple tunneling emitters and control circuitry.

FIG. 4 is an exemplary embodiment of an integrated circuit 52 that includes at least one integrated emitter 100 but preferably a plurality of integrated emitters 100 arraigned in an array. An emitter control circuit 72 is integrated onto the integrated circuit 52 and used to operate the at least one integrated emitter 100.

Figure 5:
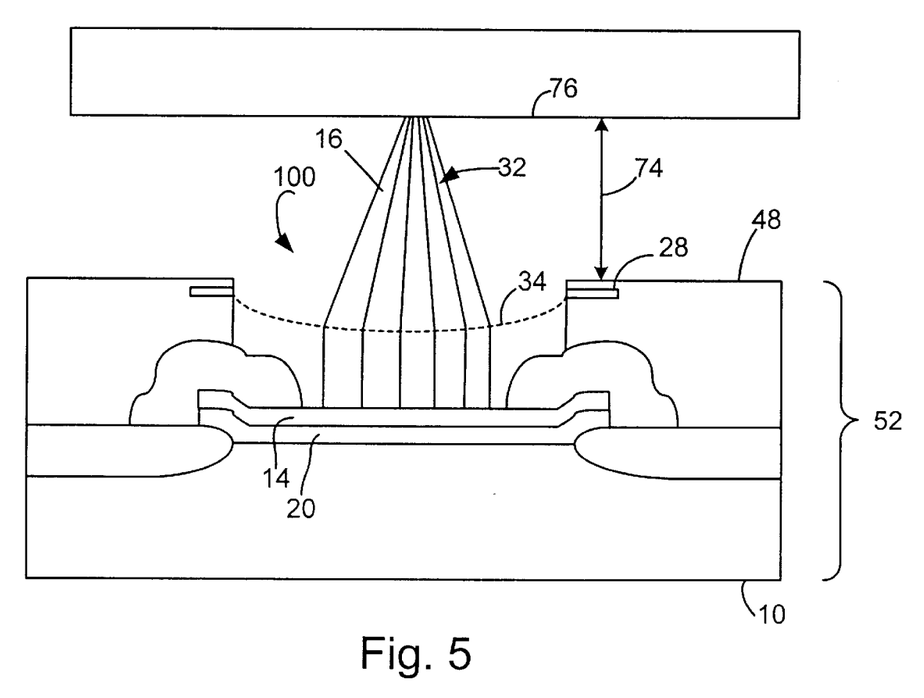
FIG. 5 is an exemplary illustration of a tunneling emitter on an integrated circuit that includes a lens for focusing the energy emissions from the tunneling emitter.

FIG. 5 is an exemplary embodiment of an integrated circuit 52 that includes an integrated emitter 100 and a lens array 48. The integrated circuit 52 is formed on a conductive substrate 10, preferably heavily doped silicon or a conductive material such as a thin film conductive layer to provide an electron source. On the substrate 10 is disposed a tunneling layer 20 having a thickness between about 50 Angstroms and about 5000 Angstroms, preferably about 100 Angstroms although about 50 to about 750 Angstroms is further preferable for some applications and materials. Different layers of semiconductor thin-film materials are applied to the substrate 10 and etched to form the integrated emitter 100. Disposed on the tunneling layer 20 is a cathode layer 14, preferably a thin-film conductive layer of platinum, gold, molybdenum, iridium, ruthenium, tantalum, chromium, or other refractive metals or alloys thereof. The cathode layer 14 forms a cathode surface from which energy in the form of electrons and photons are emitted. The lens array 48 is applied using conventional thin-film processing and includes a lens 28 defined within a conductive layer and aligned with the integrated emitter 100 to focus the energy from the integrated emitter 100 onto a surface of an anode structure 76. Anode structure 76 is located a target distance 74 from the integrated circuit 52.

Figure 6:
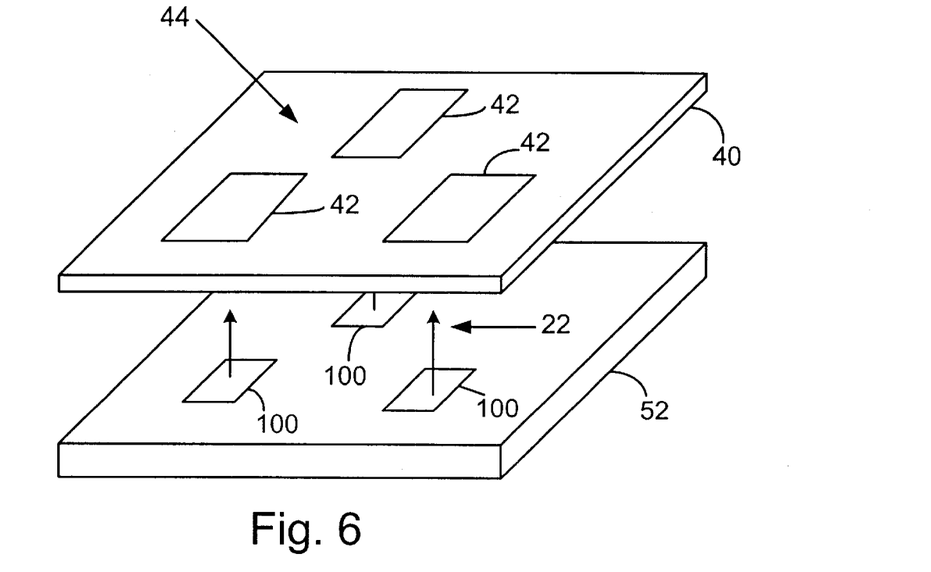
FIG. 6 is an exemplary display that is created from an integrated circuit that includes multiple tunneling emitters and an anode structure that creates or passes photons.

FIG. 6 is an alternative embodiment of a display application using the integrated emitter 100 of the invention. In this embodiment, a plurality of emitters 100 is arranged and formed in an integrated circuit 52. Each of the emitters 100 emits energy emission 22 in the form of electron emissions 16 or photon emissions 18 (see FIG. 1). An anode structure, display 40, receives the emitted energy in display pixel 44, made up of display sub-pixels 42. Display sub-pixel 42 is preferably a phosphor material that creates photons when struck by the electron emission 16 of energy emission 22. Alternatively, display sub-pixel 42 can be a translucent opening to allow photon emission 18 of energy emission 22 to pass through the display 40 for direct photon viewing.

Figures 7A, 7B:
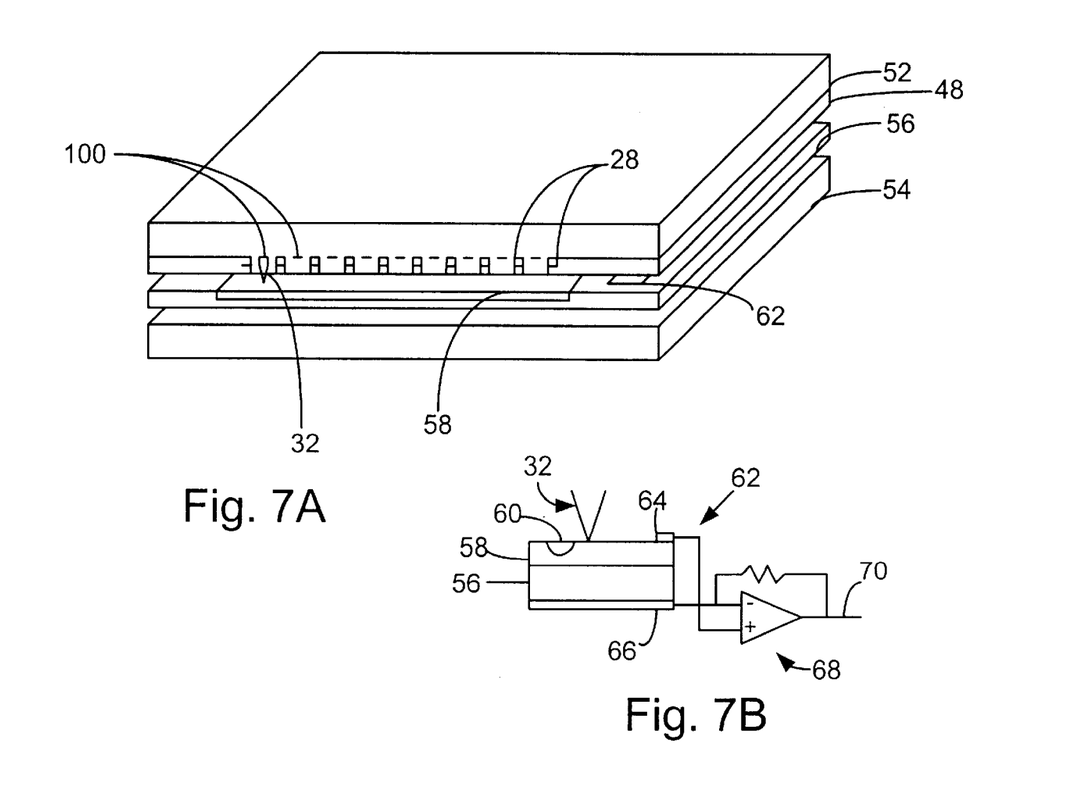
FIG. 7A is an exemplary storage device that incorporates an integrated circuit that includes multiple tunneling emitters for reading and recording information onto a rewriteable media.
FIG. 7B is a schematic of an exemplary read circuit incorporated into the exemplary storage device of FIG. 7A.

FIG. 7A is an alternative use of an integrated emitter 100 within in a storage device. In this exemplary embodiment, an integrated circuit (IC) 52 having a plurality of integrated emitters 100 has a lens array 48 of focusing mechanisms aligned with integrated emitters 100. The lens array 48 is used to create a focused beam 32 that is used to affect a recording surface, media 58. Media 58 is applied to a mover 56 that positions the media 58 with respect to the integrated emitters 100 on IC 52. Preferably, the mover 56 has a reader circuit 62 integrated within.

In FIG. 7B, the reader 62 is shown as an amplifier 68 making a first ohmic contact 64 to media 58 and a second ohmic contact 66 to mover 56, preferably a semiconductor or conductor substrate. When a focused beam 32 strikes the media 58, if the current density of the focused beam is high enough, the media is phase-changed to create an effected media area 60. When a low current density focused beam 32 is applied to the media 58 surface, different rates of current flow are detected by amplifier 68 to create reader output 70. Thus, by affecting the media with the energy from the integrated emitter 100, information is stored in the media using structural phase changed properties of the media. One such phase-change material is $In_2Se_3$. Other phase change materials are known to those skilled in the art such as chalcogenide alloys, for example: GaSb, InSb, InSe, $Sb_2Te_3$, $Ge_2Sb_2Te_5$, InSbTe, GaSeTe, $SnSb_2Te_4$, InSbGe, AgInSbTe, (GeSn)SbTe, GeSb(SeTe), $Te_{81}Ge_{15}Sb_2S_2$, and GeSbTe.

Figure 8:
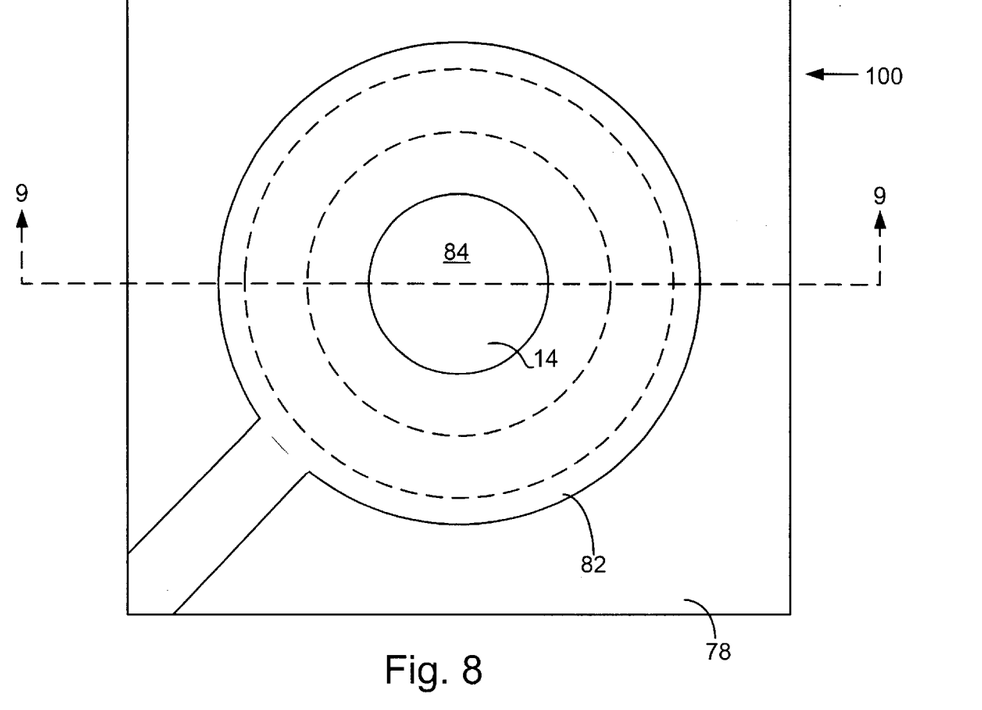
FIG. 8 is a top view of an exemplary tunneling emitter.

FIG. 8 is a top view of an exemplary embodiment of the invention of an integrated emitter 100 that includes an emitter area 84 within the cathode layer 14. The cathode layer 14 is electrically coupled to and disposed beneath conductive layer 82 that is further partially disposed over insulator layer 78. Integrated emitter 100 is shown as preferably a circular shape, however other shapes can be used. The circular shape is preferable in that the electric fields generated are more uniform as there are no discrete edges within the shape which may affect the electric field strength.

Figure 9:
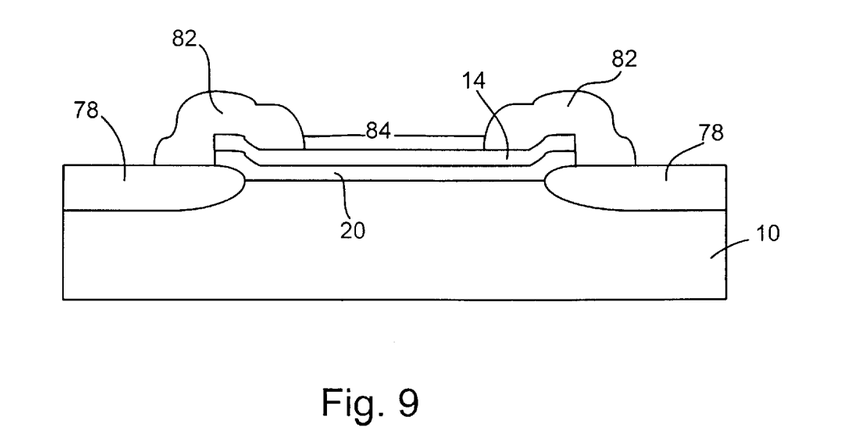
FIG. 9 is an exemplary cross-sectional view of the tunneling emitter shown in FIG. 8.

FIG. 9 is a cross-section of the exemplary embodiment of integrated emitter 100 shown in FIG. 8 looking into the 9—9 axis. A substrate 10, preferably a conductive layer or a highly doped semiconductor provides an electron supply to tunneling layer 20 that is disposed within an opening defined within an insulator layer 78 and partially over the surface of insulator layer 78. A cathode layer 14, preferably a thin-film conductive layer is disposed over the tunneling layer 20 and partially beneath the conductive layer 82 thereby making electrical contact with the conductive layer. Optionally, an adhesion layer, such as tantalum, can be applied before conductive layer 82 to provide for a bonding interface between the conductive layer 82 and the insulator layer 78 depending on the particular materials chosen for insulator layer 78 and conductive layer 82.

Figure 10:
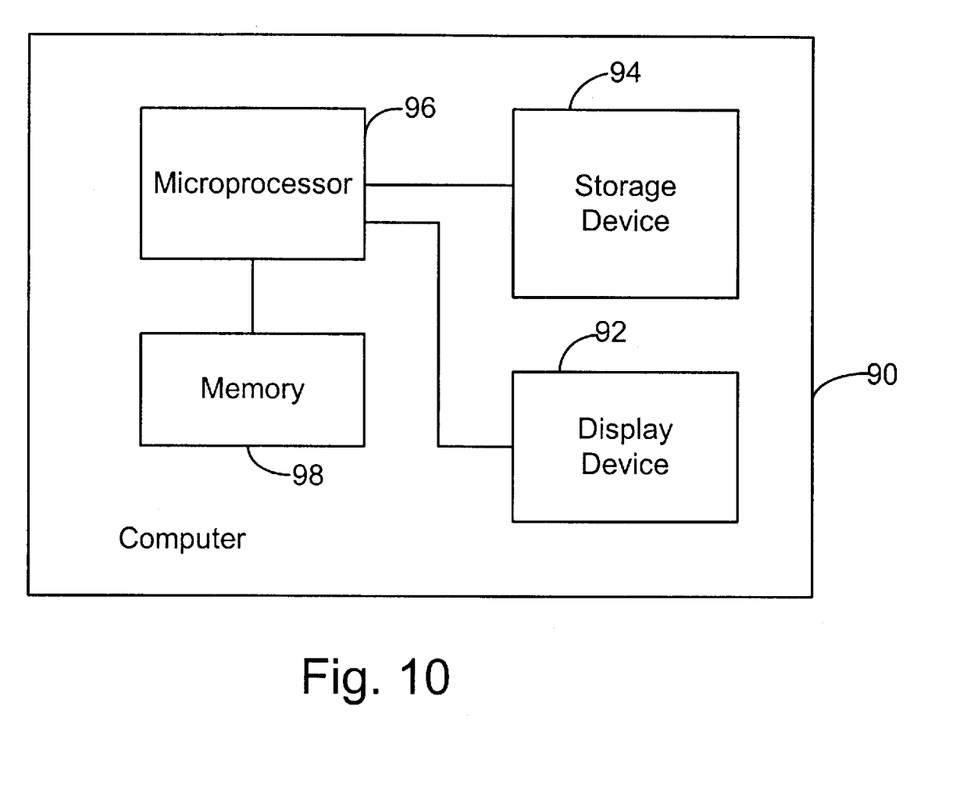
FIG. 10 is an exemplary block diagram of a computer that incorporates at least one of the electronic devices, a display or storage device, which incorporate the tunneling emitters of the invention.

FIG. 10 is an exemplary block diagram of a computer 90 that includes a microprocessor 96, memory 98, which is coupled to the microprocessor 96, and electronic devices, a storage device 94 and a display device 92. The electronic devices are coupled to the microprocessor 96. The microprocessor 96 is capable of executing instructions from the memory to allow for the transfer of data between the memory and the electronic devices, such as the storage device 94 and the display device 92. Each electronic device includes an integrated circuit that has an emitter incorporating the invention and preferably a focusing device for focusing the emissions from the emitter. The emitter has an electron supply layer with an insulating layer disposed thereon. The insulating layer has an opening defined within which a tunneling layer is formed on the electron supply layer. On the tunneling layer is a cathode layer. Preferably but optionally, the integrated circuit with the emitter has been subjected to an annealing process thereby increasing the supply of electrons that can tunnel from the electron supply layer to the cathode layer.

Figure 11A:
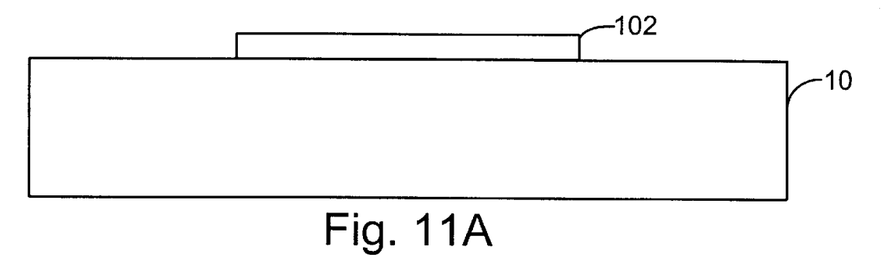
FIGS. 11A–11J are illustrations of exemplary steps used in a first exemplary process to create the tunneling emitter of the invention.

FIGS. 11A to 11J illustrate exemplary process steps used to create an emitter incorporating the invention. In FIG. 11A, a mask 102, of dielectrics or photoresist is applied to a substrate 10, preferably a silicon semiconductor substrate, although substrate 10 might be a conductive thin-film layer or a conductive substrate. Preferably substrate 10 has a sheet resistance of about 100 to 0.0001 ohms centimeter.

Figure 11B:
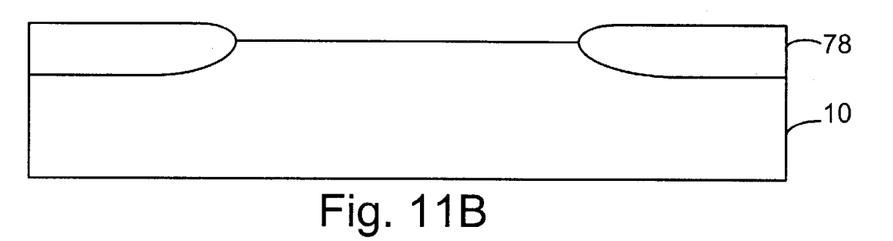

In FIG. 11B an insulator layer 78 is created, preferably by field oxide (FOX) growth when substrate 10 is a silicon substrate. Optionally, the insulator layer 78 can be formed of other oxide, nitride, or other conventional dielectrics deposited or grown alone or in combination using conventional semiconductor processes. The insulator layer 78 is created on substrate 10 except in areas covered by mask 102. The area defined by mask 102, and thus the resulting voids or defined openings within insulator layer 78 determines the location and shape of the latter formed integrated emitter 100 when mask 102 is removed.

Figure 11C:
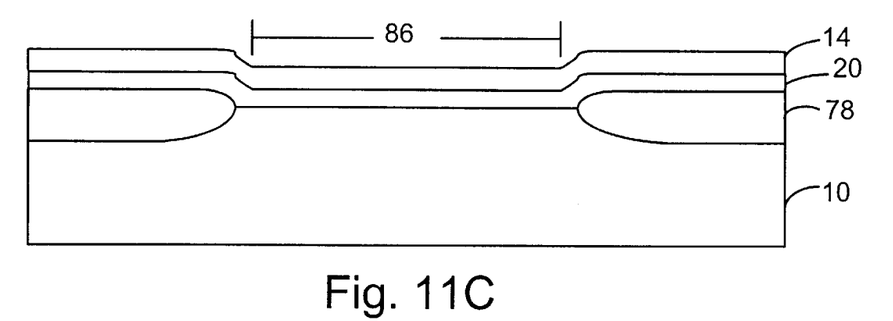

In FIG. 11C, a tunneling layer 20 is applied on the substrate 10 and insulator layer 78. Preferably, a silicon-based dielectric used as tunneling layer 20 is applied using plasma enhanced chemical vapor deposition (PECVD). Other deposition techniques are known to those skilled in the art. The tunneling layer 20 is preferably SiC, $SiN_x$, $Si_3N_4$ (RI~2.0), or $Si_xN_y$ (x:y>¾, RI~2.3). Optionally, $F_y$—$SiO_x$ and $C_y$—$SiO_x$ are envisioned as suitable material for tunneling layer 20. The silicon-based dielectric used as tunneling layer 20 is preferably about 250 to about 5000 Angstroms thick.

Optionally, a tunneling layer 20 of preferably a high dielectric strength material such as metal cluster dielectrics, $TiO_x$, $TaO_x$, WSiN, $TaAlO_xN_y$, $TaAlO_x$ or $AlO_xN_y$, but preferably $TiO_x$, is applied over the surface of the processed substrate 10 and insulator layer 78. The metal cluster dielectric used tunneling layer 20 is preferably deposited by sputtering metal and introducing oxygen and/or nitrogen to form the dielectric to a thickness of less than about 500 Angstroms, preferably between about 50 to about 250 Angstroms, such as about 100 Angstroms.

Although two types of tunneling materials have been illustrated, other tunneling materials can be used to provide the tunneling layer 20 and still meet the spirit and scope of the invention.

After tunneling layer 20 has been deposited a cathode layer 14 is deposited, sputtered or otherwise applied onto the tunneling layer 20. FIG. 1C shows the result of the application of a cathode layer 14 over the surface of the processed substrate 10. The cathode layer 14 is preferably a thin-film metallic layer such as platinum or gold and preferably has a thickness of about 50 to about 250 Angstroms. Other metals can be used for cathode layer 14 such as molybdenum, iridium, ruthenium, tantalum, chromium, or other refractive metals or alloys thereof, to name a few. The cathode layer 14 disposed on tunneling layer 20 within the opening of insulator layer 78 forms the emitter surface 86

Figure 11D:
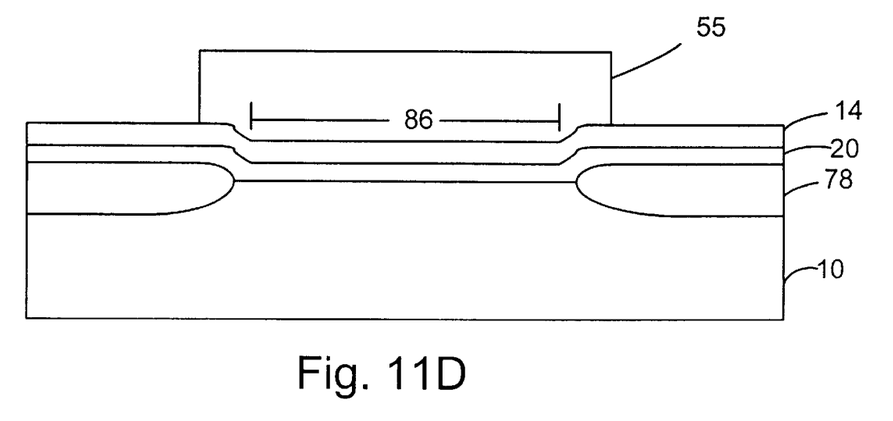
Figure 11E:
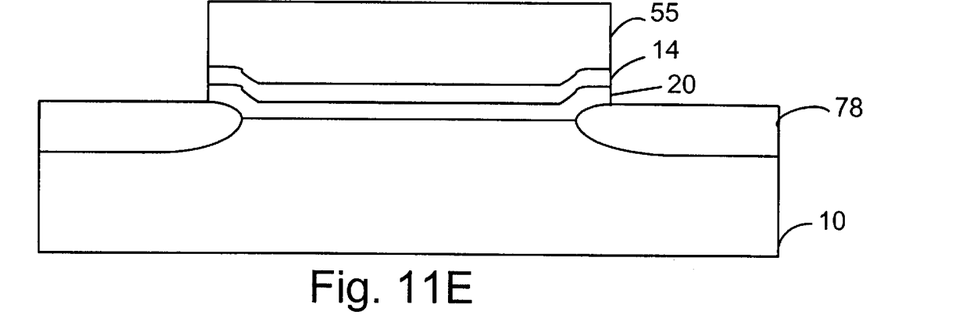

FIG. 11D shows the applying of an etch photomask 55 disposed over the emitter surface 86 and partially over the insulator layer 78 to define the shape and location of the emitter structure. FIG. 11E shows the result of an etch of the cathode layer 14 and the tunneling layer 20.

Figure 11F:
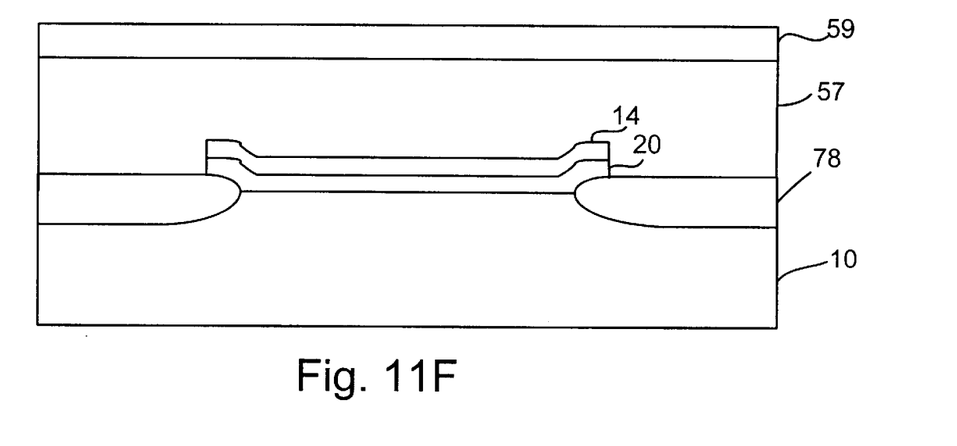

FIG. 11F shows the applying of a first photoresist layer 57 after etch photomask 55 has been stripped and a second photoresist layer 59 on the processed substrate 10 used to create a reentrant profile. Preferably, first photoresist layer 57 is a thick coat of resist that has photoactive compound (PAC) that is stable at very high temperatures (i.e. greater than about 130C). After the first photoresist layer 57 is applied it is preferably soft baked. Then the first photoresist layer 57 is flood exposed at an energy level depending on the type of etch profile required. The first photoresist layer 57 is then hard baked at about 120C to about 150C for 90 to 180 seconds on a hot plate.

The second photoresist layer 59 is applied preferably in a thin coat by either spinning or deposition on top of the first photoresist layer 57 and then baked at about 90 to about 10C for about 60 seconds. The baking of the second photoresist layer 59 redistributes its PAC into the first photoresist layer to create a variable density of PAC photoresist layer 61.

Figure 11G:
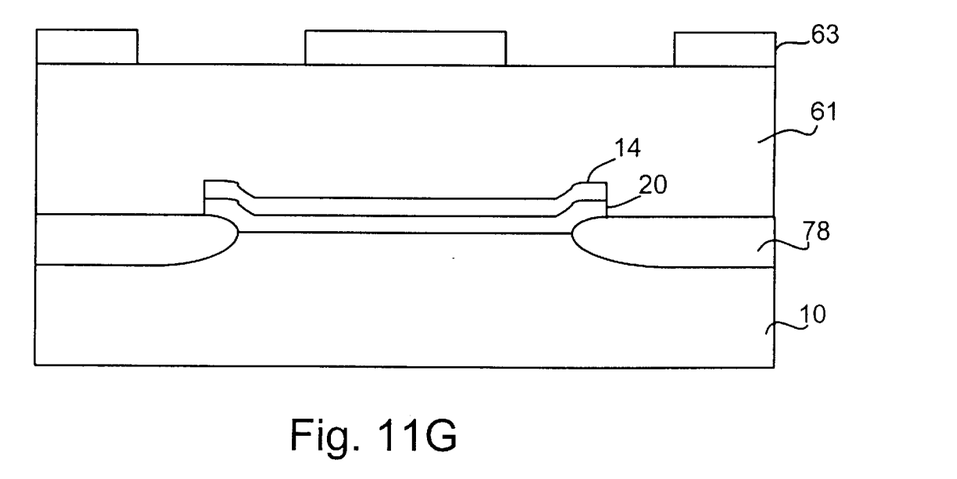

In FIG. 11G, a photomask 63 is applied on the surface of the variable density photoresist layer 61 to define the emitter shape and location.

Figure 11H:
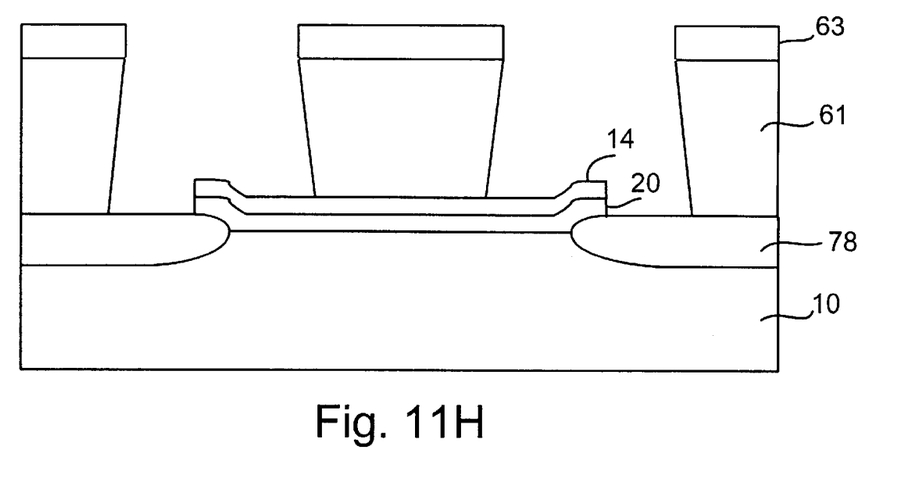

In FIG. 11H, the variable density photoresist layer 61 is developed in TMAH (tetramethyl ammonium hydroxide) based developer or other for about 20 to about 60 seconds depending on the applied thickness. This developing process creates a highly re-entrant profile useful in preventing further deposited metal from adhering to the walls of the etched opening. Conventional processes allow deposited metal to form on near vertical or non-reentrant sidewalls. This sidewall deposited metal creates problems in that the metal on the sidewall can lead to pieces that remain on the processed substrate and cause shorts or contamination. Also, it is difficult to etch a metal trace and stop on thin metal.

Alternative methods for creating the re-entrant side wall profile include modifying the exposure energy during the flood exposure stage, using dyed/undyed resist, using high/low contrast resist, and controlling the relative dissolution rate of the first photoresist layer 57 and the second photoresist layer 59 in developer by controlling the solvent and PAC in the first photoresist layer 57 using post-flood exposure bake conditions such as temperature and time. The basic theory used is to create an appropriate gradient of PAC in the positive photoresist. The resist is then exposed to radiation and developed. The rate of dissolution of resist is inversely proportional to the PAC concentration and hence can create a non-vertical side wall profile such as the re-entrant structure shown.

Figure 11I:
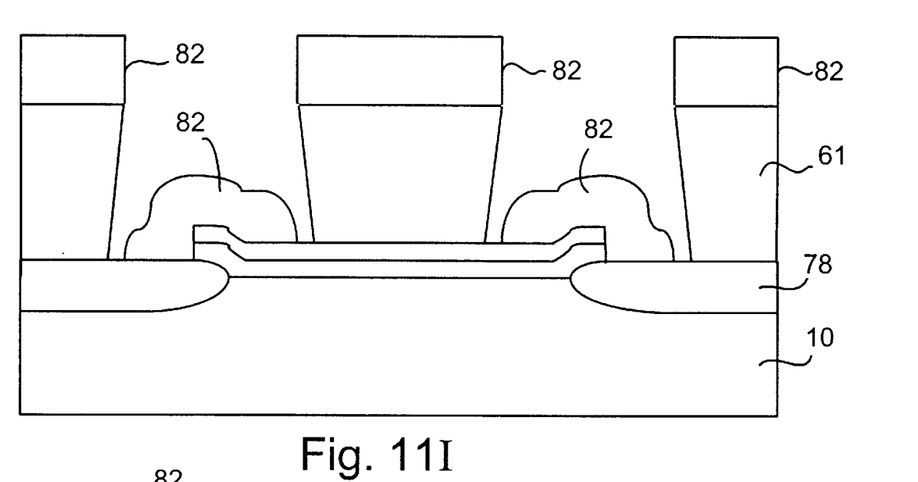

In FIG. 11I, the photomask 63 has been preferably stripped and conductive layer 82 deposited or sputtered onto the processed substrate 10. Before applying the conductive layer an optional adhesive layer is applied first to increase the adhesion to insulator layer 78. The optional adhesive layer is preferably tantalum when the later applied conductive layer 82 is gold. Preferably, the adhesive layer is applied using conventional deposition techniques. The adhesive layer is preferably up to about 200 Angstroms thick. The conductive layer 82 is applied on the previously applied layers on substrate 10, such as the adhesive layer if used. Preferably, the conductive layer 82 is formed using conventional deposition techniques. The conductive layer is preferably gold that is about 500 to about 1000 Angstroms thick.

Figure 11J:
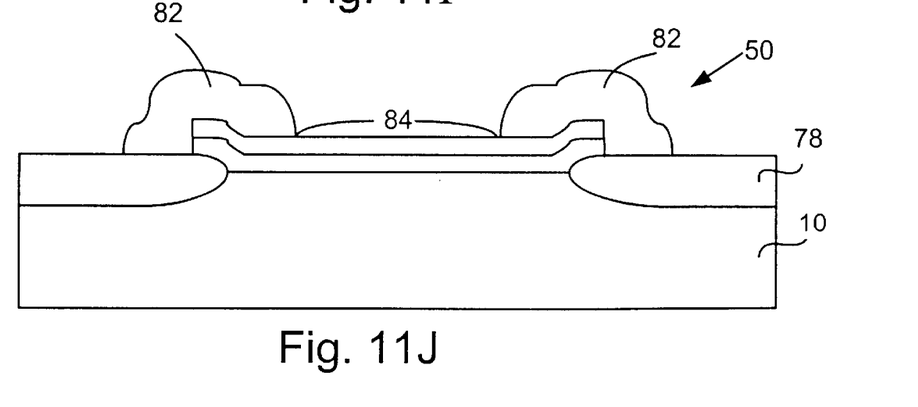

In FIG. 11J a lift-off process is used to remove variable density photoresist layer 61 and the portion of conductive layer 82 that is disposed on it to create the emitter device 50. Preferably, low temperature plasma is used to reactively etch ash organic materials within the variable density photoresist layer 61. The gas used is preferably oxygen in a planer plasma etch process. The processed substrate 10 is placed in a chamber and the oxygen is introduced and excited by an energy source to create a plasma field. The plasma field energizes the oxygen to a high energy state, which, in turn oxidizes the variable density photoresist layer 61 components to gases that are removed from the chamber by a vacuum pump Optionally, a wet lift-off process can be used in lieu of the plasma lift-off process. The processed substrate 10 is immersed in a solvent with megasonic or ultrasonic agitation that will swell and remove the variable density photoresist layer 61 and that portion of conductive layer 82 that is disposed on it.

Figure 12A:
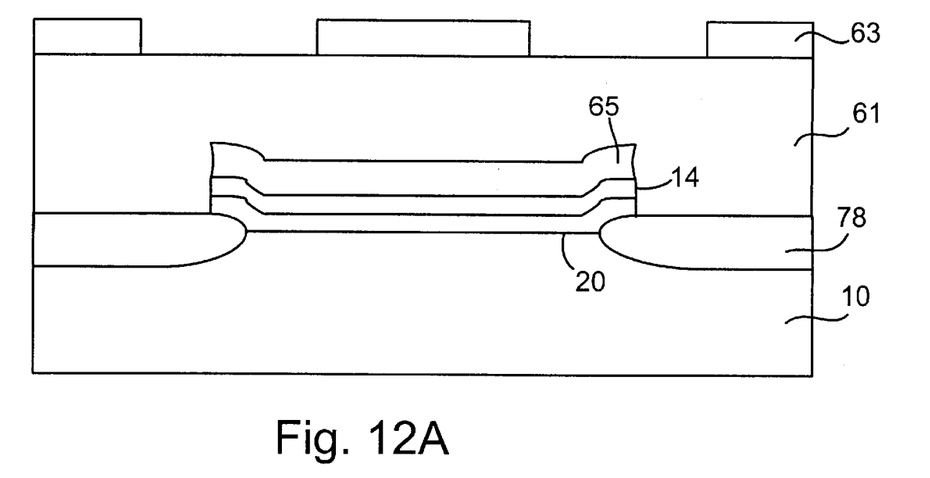
FIGS. 12A–12D are illustrations of exemplary steps used in a second exemplary process to create the tunneling emitter of the invention.

FIGS. 12A–12D illustrate exemplary alternative process steps to those shown in FIGS. 11A–11J that can be used to create an alternative emitter device 50'. In FIG. 12A, a protective layer 65 is applied after application of the cathode layer 14 Preferably the protective layer 65 is a layer of titanium or molybdenum and is used to prevent contamination of the emitter surface 86 on cathode layer 14 during further processing. The variable density photoresist layer 61 is applied on the surface of the processed substrate 10 and patterned and exposed with photomask 63.

Figure 12B:
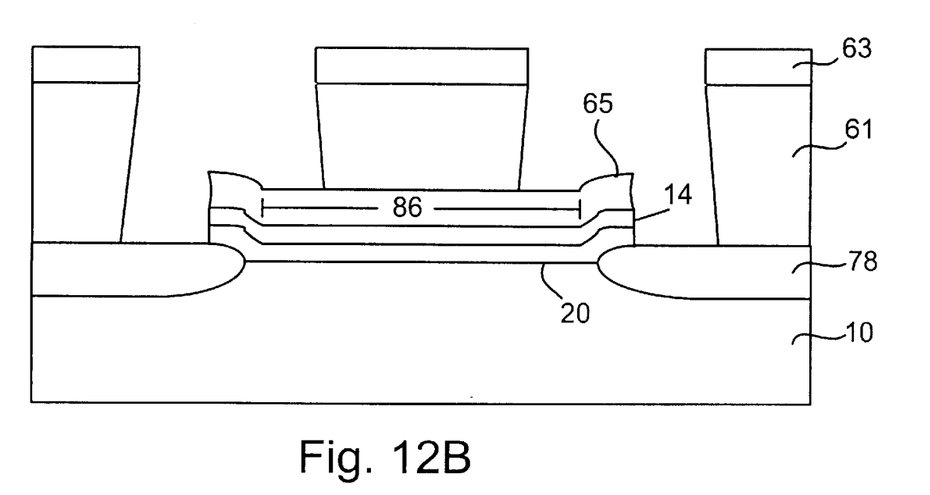

FIG. 12B illustrates the results of etching the variable density photoresist layer 61 to form a highly re-entrant profile.

Figure 12C:
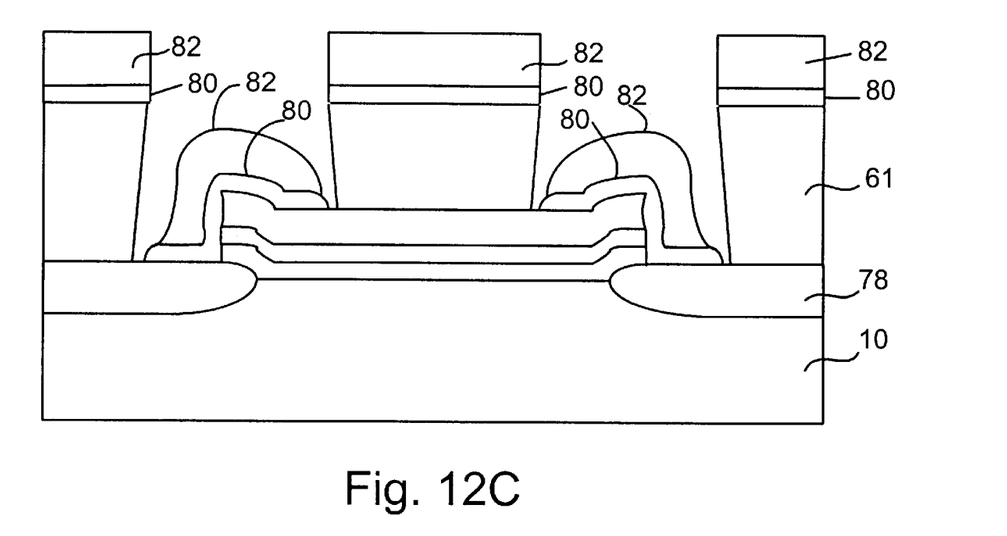

FIG. 12C illustrate the application of an adhesion layer 80 such as tantalum, and the conductive layer 82, such as gold, to the processed substrate 10 Because the sidewalls of the etched variable density photoresist layer 61 are highly re-entrant, neither the adhesion layer 80 or the conductive layer 82 are deposited on the sidewalls.

Figure 12D:
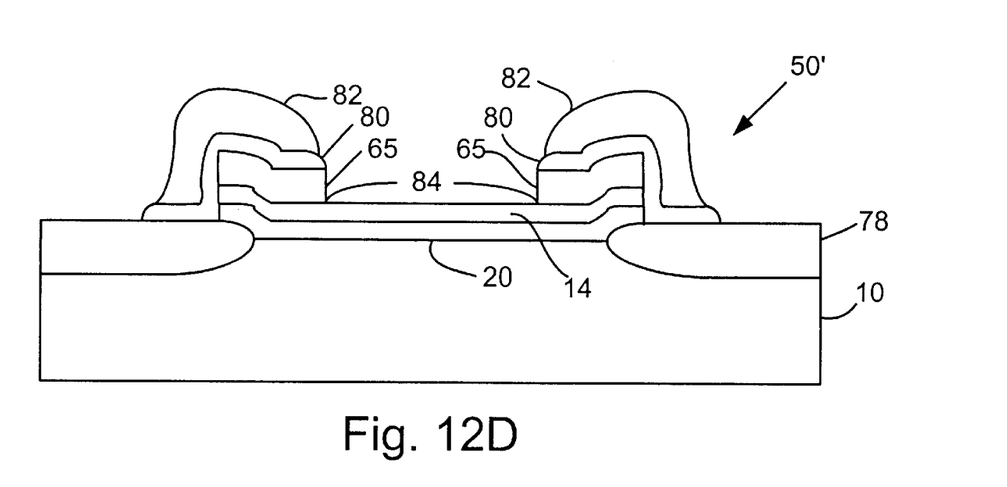

FIG. 12D illustrates the result of using a lift-off process to remove the variable density layer 61 and the adhesive layer 80 and conductive layer 82 portions that are disposed on it. The alternative emitter device 50' is then selectively etched to remove the protective layer 65 to expose the emitter area 84.

By using integrated circuit thin film technology to fabricate the emitter, it can be integrated along with traditional active circuits found on conventional integrated circuits. The integrated circuit with the emitter can be used in display devices or storage devices as previously described. Preferably, after fabrication, the emitter is subjected to an annealing process to increase the amount of emission from the emitter.

Figure 13A:
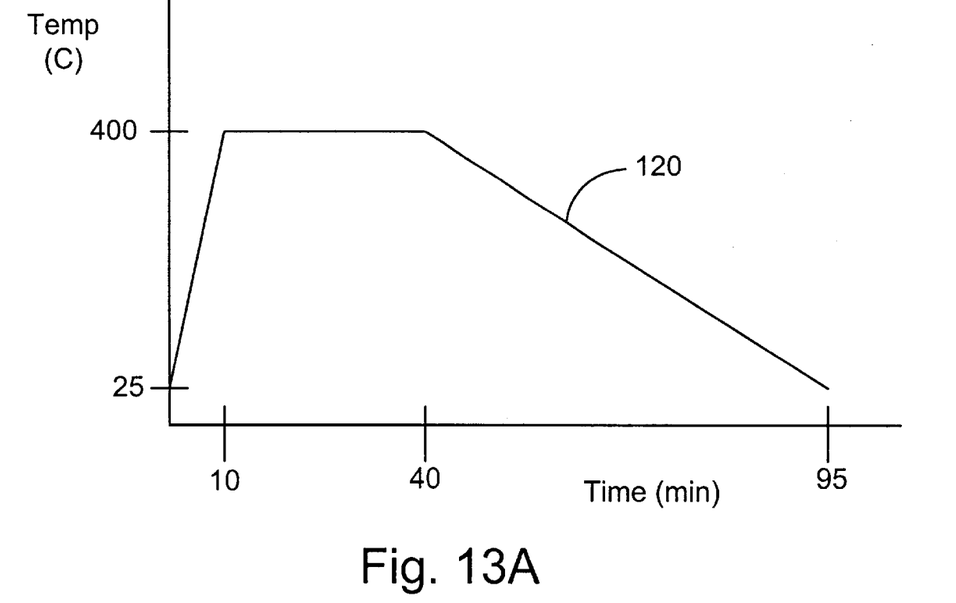
FIGS. 13A and 13B are charts of exemplary annealing processes used to optionally improve the tunneling emitters of the invention.
Figure 13B:
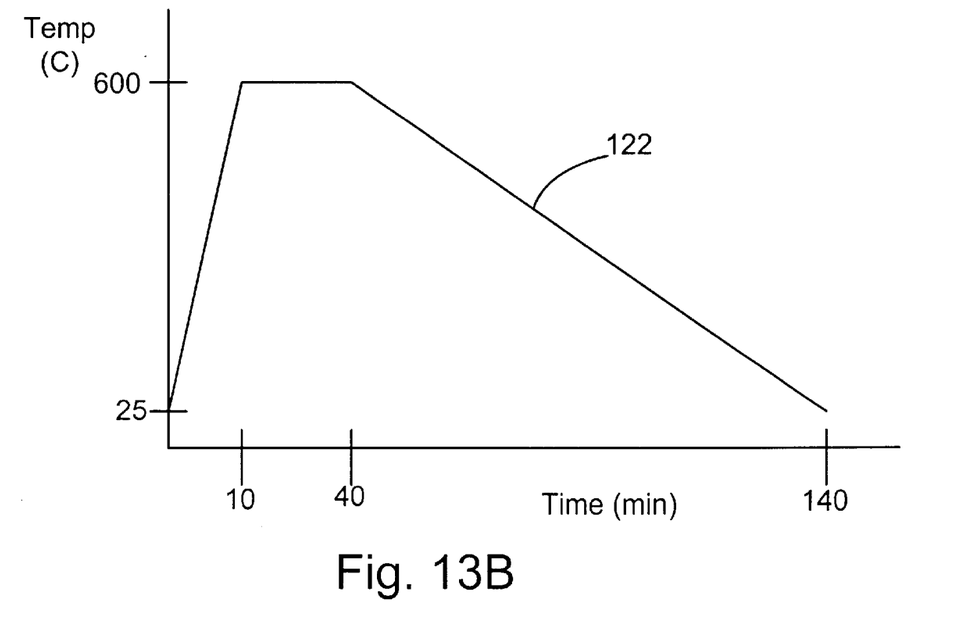

FIGS. 13A and 13B are charts of exemplary annealing processes which are used to increase the emission current capability of an emitter embodying the invention. The annealing process also increases the device yields and quality by allowing the emitters to last longer. The annealing process, among other benefits, helps to decrease the resistance of contacts of dissimilar metals thereby increasing the current flow to the emitters.

In FIG. 13A, a first thermal profile 120 shows the processed substrate that includes an emitter incorporating the invention first elevated to a temperature of about 400 C within 10 minutes then held at this temperature for 30 minutes. Then the processed substrate is slowly cooled back to room temperature (about 25 C) over a period of about 55 minutes. In FIG. 13B, a second thermal profile 122 shows the processed substrate including an emitter incorporating the invention heated to a temperature of about 600 C within 10 minutes and held at that temperature for about 30 minutes. Then, the processed substrate is gradually cooled to room temperature over a period of about 100 minutes. Those skilled in the art will appreciate that the elevated temperature and the rate of cooling can be modified from the exemplary processes described and still meet the spirit and scope of the invention. By annealing the substrate that includes at least one emitter incorporating the invention, several characteristics of the emitter are improved.

It should be noted that it would be obvious to those skilled in the art that many variations and modifications may be made to the disclosed embodiments without substantially departing from the invention. All such variations and modifications are intended to be included herein within the scope of the present invention, as set forth in the following claims.

What is claimed is:

1. A method for creating an emitter on an electron supply, comprising the steps of:
    applying a tunneling layer on an electron source;
    applying a cathode layer on the tunneling layer;
    applying a variable density photoresist layer over the cathode layer; and
    developing the variable density photoresist layer to create developed openings each having a re-entrant profile exposing a portion of the cathode layer; and
    applying a conductive layer within the developed openings on the cathode layer.

2. The method of claim 1 wherein the step of applying a conductive layer further includes the step of applying an adhesive layer before applying the conductive layer.

3. The method of claim 1 wherein the step of applying the cathode layer further comprises the step of applying a protective layer over the cathode layer before the step of applying the variable density photoresist layer.

4. The method of claim 1 further comprising the step of annealing the emitter.

5. The method of claim 1 wherein the step of applying the tunneling layer further comprises the step of applying a silicon-based dielectric from the group consisting of SiC, $SiN_x$, $Si_xN_y$, $Si_3N_4$, $F_y$—$SiO_x$, and $C_y$—$SiO_x$ on the electron source.

6. The method of claim 1 wherein the step of applying the tunneling layer further comprises the step of applying a metal cluster dielectric from the group consisting of $TiO_x$, $TaO_x$, WSiN, $TaAlO_xN_y$, $TaAlO_x$, and $AlO_xN_y$ on the electron source.

7. The method of claim 1 wherein the applied tunneling layer has a thickness between about 50 Angstroms and about 5000 Angstroms.

8. The method of claim 1 wherein the cathode layer is selected from the group consisting of platinum, gold, molybdenum, ruthenium, tantalum, iridium, other refractory metals and alloys thereof.

9. A method for creating an emitter on an electron supply, comprising the steps of:
    applying a tunneling layer over an insulating layer disposed on the electron supply, the insulator layer defining an opening to the electron supply;
    applying a cathode layer to adhere to the tunneling layer;
    applying a variable density photoresist layer on the cathode layer and insulating layer;
    creating an opening in the variable density photoresist layer to the cathode layer; and
    lifting off the variable density photoresist layer to remove it from the cathode layer and insulating layer.

10. The method of claim 9 further comprising the step of annealing the processed emitter to increase the tunneling current.

11. The method of claim 9 wherein the applied tunneling layer has a thickness less than about 500 Angstroms.

12. The method of claim 9 further comprising the step of applying a conductive layer partially on the cathode layer and partially on the insulator layer.

13. A method for creating an emitter on an electron supply surface, the method comprising the steps of:
    creating an insulator layer on the electron supply surface;
    defining an emission area within the insulator layer;
    applying a tunneling layer over the insulator layer and the emission area;
    applying a cathode layer over the tunneling layer;
    etching the cathode and tunneling layers;
    applying a variable density photoresist layer on the cathode layer and insulator layer;
    developing the variable density photoresist layer to create re-entrant openings exposing a portion of the cathode layer;
    applying a conduction layer on the variable density photoresist layer and within the re-entrant openings onto the cathode layer; and
    lifting off the variable density photoresist layer and the conduction layer disposed upon it.

14. The method of claim 13 further comprising the step of annealing the processed emitter.

15. The method of claim 13 wherein the applied tunneling layer has a thickness less than 500 Angstroms.

16. The method of claim 13 wherein the applied tunneling layer has a thickness in the range of about 50 to 5000 Angstroms.

* * * * *